United States Patent [19]

Zumsteg

[11] 4,427,952
[45] Jan. 24, 1984

[54] OSCILLATOR CIRCUIT WITH DIGITAL TEMPERATURE COMPENSATION

[75] Inventor: Alphonse Zumsteg, Solothurn, Switzerland

[73] Assignee: Societe Suisse pour l'Industrie Horlogere Management Services SA, Bienne, Switzerland

[21] Appl. No.: 221,384

[22] Filed: Dec. 30, 1980

[30] Foreign Application Priority Data

Jan. 10, 1980 [CH] Switzerland .......................... 158/80

[51] Int. Cl.³ .............................................. H03L 1/02
[52] U.S. Cl. ..................................... 331/176; 331/37; 331/46
[58] Field of Search ................. 331/176, 46, 48, 162, 331/116 R, 37, 158; 368/159, 200-202

[56] References Cited

U.S. PATENT DOCUMENTS

| 4,071,797 | 1/1978 | Zumsteg et al. | |
| 4,159,622 | 7/1979 | Akahane | 331/176 X |
| 4,344,046 | 8/1982 | Zumsteg | 331/176 X |
| 4,345,221 | 3/1982 | Zumsteg | 331/176 |

FOREIGN PATENT DOCUMENTS

| 55-42001 | 3/1980 | Japan | 368/202 |
| 453223 | 6/1968 | Switzerland . | |
| 2004155 | 3/1979 | United Kingdom | 331/176 |

OTHER PUBLICATIONS

Effenburger, "Digitale Temperaturkompensation von Schwingquarzoszillatoren mit Automatischem Frequenzabgleich," *Jahrbuch der Deutschen fur Chronometrie,* vol. 28, 1977 (Stuttgart, Germany); pp. 9–15.
Electronics Letters, Jul. 10, 1975, vol. II, No. 14; pp. 304–305.

Primary Examiner—Siegfried H. Grimm
Assistant Examiner—Edward P. Westin
Attorney, Agent, or Firm—Wender, Murase & White

[57] ABSTRACT

The oscillator circuit comprises a digital temperature compensation circuit connected to a low and a high frequency quartz oscillator. The two quartz oscillators have the same inversion temperature points and a different temperature behaviour.

In the temperature compensation circuit a beat frequency is produced between the divided signal of the high frequency oscillator and the frequency of the low frequency oscillator and then fed to a correction circuit and multiplied therein with a correction factor which has been stored in a PROM. The obtained correction signal is fed into the frequency divider chain for obtaining a temperature compensated outgoing signal for use in a timer circuit.

The temperature compensation circuit is simply designed and allows high accuracy, which is particularly well suited for a wristwatch or a photo camera.

6 Claims, 2 Drawing Figures

OSCILLATOR CIRCUIT WITH DIGITAL TEMPERATURE COMPENSATION

BACKGROUND OF THE INVENTION

The present invention concerns an oscillator circuit having digital temperature compensation utilizing two quartz oscillators, the quartz oscillators have different temperature behavior and the same inversion temperature.

In the GB-Patent Application No. 2,004,155 an oscillator is described, whereby two low frequency oscillators with a frequency of 32 kHz, usual for watch circuits, are used, having as far as possible the same quadratic temperature coefficients and different inversion temperatures.

It is known however that such low frequency quartzes are submitted to an appreciable ageing, cancelling much of the advantages of temperature compensation.

It is therefore an object of the present invention to disclose an oscillator circuit with digital temperature compensation offering without great expenditure a greater precision and suffering from less ageing.

BRIEF SUMMARY OF THE INVENTION

According to the present invention one of the two oscillators is a high frequency oscillator.

BRIEF DESCRIPTION OF THE DRAWING

The invention will be described further, by way of example, with reference to the accompanying drawings, in which.

DESCRIPTION OF THE PREFERRED EMBODIMENT

The correction of the temperature compensation should be as small as possible, because the smaller the correction the smaller is the precision required for this correction. Therefore it has to be looked for oscillators which frequency deviations are small, for example such with high frequency quartz oscillators according to U.S. Pat. No. 4,071,797.

Figure 1:
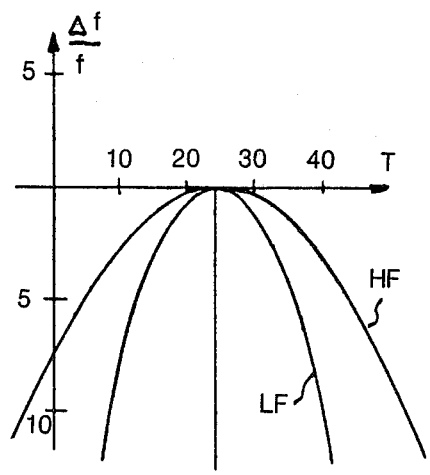
FIG. 1 shows the parabolic temperature behavior of a high and of a low frequency resonator with a determined tuning.

FIG. 1 shows the parabolic temperature behavior of the above-mentioned high frequency oscillator after division from 4.19 MHz to 32 kHZ, and the parabolic temperature behaviour of a known low frequency oscillator with a frequency of 32 kHZ.

We have:

$$f_1(T) = f_{10}(1 + \beta_1(T-T_1)^2 + \gamma(T-T_1)^3)$$

and $$f_2(T) = f_{20}(1 + \beta_2(T-T_2)^2),$$

wherein $f_{10}$ is the frequency of the high frequency oscillator HF after frequency division and $f_{20}$ is the frequency of the low frequency resonator LF, and $T_1, T_2$ are the inversion temperatures, and $\beta_1 = -1.2 \cdot 10^{-8}/(°C.)^2$ is the quadratic or parabolic temperature coefficient for the high frequency oscillator, $\beta_2 = -3.6 \cdot 10^{-8}/(°C.)^2$ is the parabolic temperature coefficient of the low frequency oscillator LF, and $\gamma$ is the cubic temperature coefficient, which will be neglected in the following examples.

For effecting the temperature compensation according to the invention the oscillators are chosen thus, that the inversion temperature points of both parabola are the same, that is that $T_1 = T_2 = T_o$.

Figure 2:
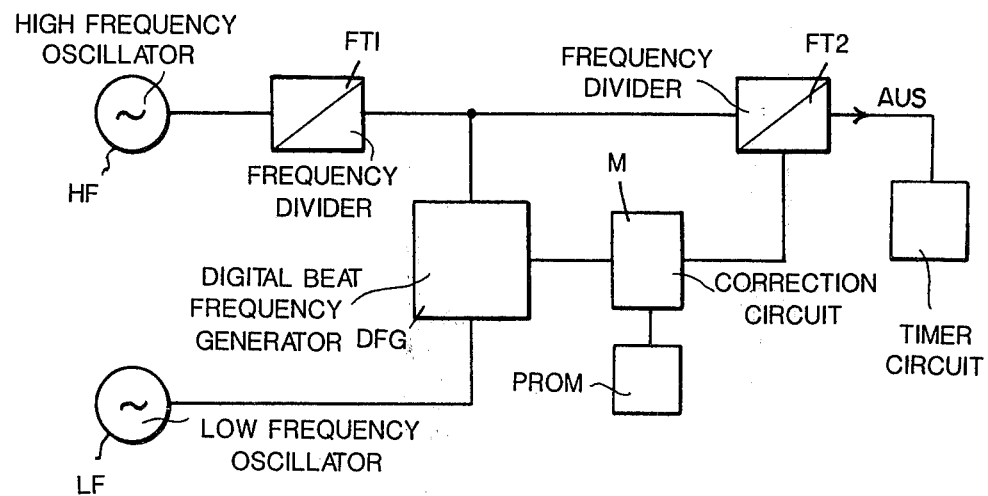
FIG. 2 shows a block circuit diagram of an oscillator circuit according to the invention.

According to a first embodiment according to the invention the frequency of 4.2 MHz of the high frequency oscillator HF is divided according to the circuit of FIG. 2 to the same frequency of 32 kHZ as the frequency of the low frequency oscillator LF, which is a quartz tuning fork type according to U.S. Pat. No. 4,071,797. The divided signal and the signal from the low frequency oscillator are fed to a digital beat frequency generator DFG.

According to the formula for the frequency of correction f(T):

$$f(T) = f_{10}[(1 + \beta_1(T-T_o)^2) + kf_{10}(T-T_o)^2(\beta_1 - \beta_2)]$$

k can be calculated as follows:

$$k = \beta_1/(\beta_2 - \beta_1)$$

which value is used in the correction circuit M and which can be stored in a PROM. After multiplication of the beat frequency with k in correction circuit M, the thus obtained correction signal is fed into the second frequency divider chain FT2 at an appropriate point. In the frequency divider chain FT2 the frequency is divided down to 1 Hz and simultaneously corrected. The outgoing signal AUS is fed into the timer circuit, which cooperates with the step motor.

The oscillator circuit described above may be used wherever a high operational accuracy, a favourable temperature and a long time behaviour is required, and wherever the space available is small. This applies, for example, in a wrist-watch or in a film camera.

I claim:

1. An oscillator circuit comprising:
   (a) a high frequency oscillator for producing a high frequency signal having a parabolic temperature dependence and an inversion temperature point;
   (b) a low frequency oscillator for producing a low frequency signal substantially lower than the high frequency signal having a parabolic temperature dependence differing from that of the high frequency oscillator and the same temperature inversion point; and
   (c) temperature compensating circuit means connected to the high and low frequency oscillators for receiving the signals, for dividing the high frequency signal, for determining the difference between the divided high frequency signal and the low frequency signal, and for multiplying the signal difference by a correction factor to produce a correction signal.

2. The oscillator circuit according to claim 1, wherein:
   (a) said high frequency oscillator produces a high frequency signal of about 4.2 MHz; and (b) said low frequency oscillator is a quartz tuning fork-type oscillator which produces a low frequency signal of about 32 kHz.

3. The oscillator circuit according to claim 1 wherein the temperature compensating circuit comprises:
   (a) a first frequency divider connected to the high frequency oscillator for dividing the high frequency signal;
   (b) a beat frequency generator connected to the first frequency divider and the low frequency oscillator for receiving the divided high frequency signal and the low frequency signal, and for producing a beat frequency signal equal to the difference between the divided high signal and the low signal; and
   (c) a correction circuit connected to the beat frequency generator for multiplying the beat frequency by a correction factor to produce a correction signal.

4. The oscillator circuit according to claim 3 further comprising:
   (a) second frequency divider means connected to one of the oscillators for dividing the oscillator signal, thereby producing an outgoing signal for use by a timer circuit; and
   (b) means for transmitting the correction signal to the second frequency divider means so that the correction signal causes the second divider to temperature compensate the outgoing signal.

5. The oscillator circuit according to claim 3 wherein:
   (a) the correction factor is stored in a PROM connected to the correction circuit.

6. The oscillator according to claim 3 wherein:
   (a) said first frequency divider divides the high frequency signal to about the same frequency as the low frequency signal.

* * * * *